United States Patent
Hollis et al.

(10) Patent No.: US 9,122,570 B2
(45) Date of Patent: Sep. 1, 2015

(54) DATA PATTERN GENERATION FOR I/O TRAINING AND CHARACTERIZATION

(71) Applicant: NANYA TECHNOLOGY CORP., Tao-Yuan Hsien (TW)

(72) Inventors: Timothy M. Hollis, Meridian, ID (US); Jeffrey P Wright, Boise, ID (US); Kang-Yong Kim, Boise, ID (US); Eric J. Stave, Meridian, ID (US)

(73) Assignee: NANYA TECHNOLOGY CORP., Gueishan Dist., Taoyuan (TW)

( * ) Notice: Subject to any disclaimer, the term of this patent is extended or adjusted under 35 U.S.C. 154(b) by 0 days.

(21) Appl. No.: 14/017,277

(22) Filed: Sep. 3, 2013

(65) Prior Publication Data

US 2015/0067197 A1    Mar. 5, 2015

(51) Int. Cl.
| | |
|---|---|
| *G06F 3/00* | (2006.01) |
| *G11C 29/00* | (2006.01) |
| *G01R 31/28* | (2006.01) |
| *G06F 13/00* | (2006.01) |
| *G06F 3/06* | (2006.01) |
| *G06F 12/00* | (2006.01) |

(52) U.S. Cl.
CPC ............ *G06F 13/00* (2013.01); *G06F 3/061* (2013.01); *G06F 3/0653* (2013.01); *G06F 3/0683* (2013.01); *G06F 12/00* (2013.01)

(58) Field of Classification Search
CPC ...... G06F 3/0653; G06F 3/061; G06F 3/0683
See application file for complete search history.

(56) References Cited

U.S. PATENT DOCUMENTS

| | | | |
|---|---|---|---|
| 6,442,628 B1 * | 8/2002 | Bastiani et al. | 710/60 |
| 6,473,873 B1 * | 10/2002 | Akamatsu et al. | 714/738 |
| 7,275,187 B2 * | 9/2007 | Kawasaki | 714/718 |
| 7,668,893 B2 * | 2/2010 | Stern | 708/252 |
| 2004/0230395 A1 * | 11/2004 | Basto | 702/117 |
| 2009/0313521 A1 | 12/2009 | Hollis | |
| 2011/0296110 A1 * | 12/2011 | Lilly et al. | 711/118 |

FOREIGN PATENT DOCUMENTS

WO       2013109284 A1     7/2013

* cited by examiner

*Primary Examiner* — Jing-Yih Shyu
(74) *Attorney, Agent, or Firm* — Winston Hsu; Scott Margo (57) ABSTRACT

A memory structure that can perform characterization of output data paths without accessing the main memory array includes: a plurality of output data paths; a plurality of registers coupled to the output data paths. The registers include: at least a first pattern register and a second pattern register, for respectively storing a first data pattern and a second data pattern; and at least a first mapping register, for storing a plurality of binary values, wherein each binary value indicates whether the first data pattern or the second data pattern should be mapped to a corresponding output data path.

14 Claims, 6 Drawing Sheets

X4 Device

| Serial | UI0 | UI1 | UI2 | UI3 | UI4 | UI5 | UI6 | UI7 |
|---|---|---|---|---|---|---|---|---|
| DQ0 | 0 | 1 | 1 | 1 | 1 | 1 | 1 | 1 |
| DQ1 | 0 | 1 | 1 | 1 | 1 | 1 | 1 | 1 |
| DQ2 | 0 | 1 | 1 | 1 | 1 | 1 | 1 | 1 |
| DQ3 | 0 | 1 | 1 | 1 | 1 | 1 | 1 | 1 |

FIG. 4A RELATED ART

X4 Device

| Parallel | UI0 | UI1 | UI2 | UI3 | UI4 | UI5 | UI6 | UI7 |
|---|---|---|---|---|---|---|---|---|
| DQ0 | 0 | 0 | 0 | 0 | 0 | 0 | 0 | 0 |
| DQ1 | 1 | 1 | 1 | 1 | 1 | 1 | 1 | 1 |
| DQ2 | 1 | 1 | 1 | 1 | 1 | 1 | 1 | 1 |
| DQ3 | 1 | 1 | 1 | 1 | 1 | 1 | 1 | 1 |

FIG. 4B RELATED ART

| Stagger | UI0-7 |
|---|---|
| DQ0 | MPR0 |
| DQ1 | MPR1 |
| DQ2 | MPR2 |
| DQ3 | MPR3 |

X4 (Read MPR0 command)

| Stagger | UI0-7 |
|---|---|
| DQ0 | MPR1 |
| DQ1 | MPR2 |
| DQ2 | MPR3 |
| DQ3 | MPR0 |

X4 (Read MPR1 command)

| Stagger | UI0-7 |
|---|---|
| DQ0 | MPR2 |
| DQ1 | MPR3 |
| DQ2 | MPR0 |
| DQ3 | MPR1 |

X4 (Read MPR2 command)

| Stagger | UI0-7 |
|---|---|
| DQ0 | MPR3 |
| DQ1 | MPR0 |
| DQ2 | MPR1 |
| DQ3 | MPR2 |

X4 (Read MPR3 command)

DATA PATTERN GENERATION FOR I/O TRAINING AND CHARACTERIZATION

BACKGROUND OF THE INVENTION

1. Field of the Invention

The invention relates to characterization of signal integrity on data output paths in a DRAM memory, and more particularly, to characterization of signal integrity on data output paths by bypassing the main array and reading data from a series of registers. The invention applies to a much broader variety of chip-to-chip interfaces, however.

2. Description of the Prior Art

Characterization of a memory interface is a crucial part of the manufacturing process. Certain parameters are set and tested in order to gauge a full operational view of the memory array, and how it operates under different conditions.

Particular design challenges are associated with Input/Output (I/O) signaling. At low speeds, problems generally only occur where transmission lines are especially long. At high speeds, however, even the shortest transmission lines can suffer from problems such as inter-symbol interference and crosstalk, due to high frequency effects.

In order to test memory read signal integrity on a number of data output paths, data patterns are written to the main array, and then read out. As the array needs to be accessed for this read operation, a certain amount of noise will be added, and the data path timing may be limited by the array timing, which makes characterization of the I/O scheme difficult.

It is therefore an objective to perform data characterization of data output paths without having to access the array.

SUMMARY OF THE INVENTION

This in mind, the present invention aims to provide a method and apparatus for characterizing signal integrity on an output data path in a read operation which is independent of the array.

A memory structure that can perform characterization of output data paths without accessing a main memory array comprises: a plurality of output data paths; and a plurality of registers coupled to the output data paths. The registers comprise: at least a first pattern register and a second pattern register, for respectively storing a first data pattern and a second data pattern; and at least a first mapping register, for storing a plurality of binary values, wherein each binary value indicates whether the first data pattern or the second data pattern should be mapped to a corresponding output data path.

A method for performing characterization of output data paths without accessing a memory array of a memory comprises: coupling a plurality of registers to the output data paths; designating a register of the plurality of registers as a first pattern register and storing a first data pattern therein; designating a register of the plurality of registers as a second pattern register and storing a second data pattern therein; designating a register of the plurality of registers as a first mapping register, and storing a plurality of binary values therein, wherein each binary value corresponds to an output data path; accessing the binary values in the first mapping register to determine whether the first data pattern or the second data pattern should be mapped to a corresponding output data path; and outputting the first data pattern or the second data pattern on a corresponding output data path according to the binary values in the first mapping register.

These and other objectives of the present invention will no doubt become obvious to those of ordinary skill in the art after reading the following detailed description of the preferred embodiment that is illustrated in the various figures and drawings.

DETAILED DESCRIPTION

In order to bypass the array when reading data on a signal output path, the present invention provides a register scheme for a memory comprising a series of registers which are located near the read path (data output path) but are independent from the main array. Data patterns are stored in the registers, and mapped to particular data paths. This means that data can be read out on output data paths without having to access the array in a read operation. The mapping operation also enables more than one data pattern to be read to the output data paths.

In an exemplary embodiment of the present invention, three 8-bit registers are provided. Please refer to FIG. 1, which is a diagram illustrating the three 8-bit registers. A first pattern register (PR<0>) 102 and a second pattern register (PR<1>) 104 are respectively used for storing a first and a second 8-bit data pattern. The third 8-bit register is a mapping register MR<0> 107, for mapping the data patterns to particular data output paths.

Figure 1:
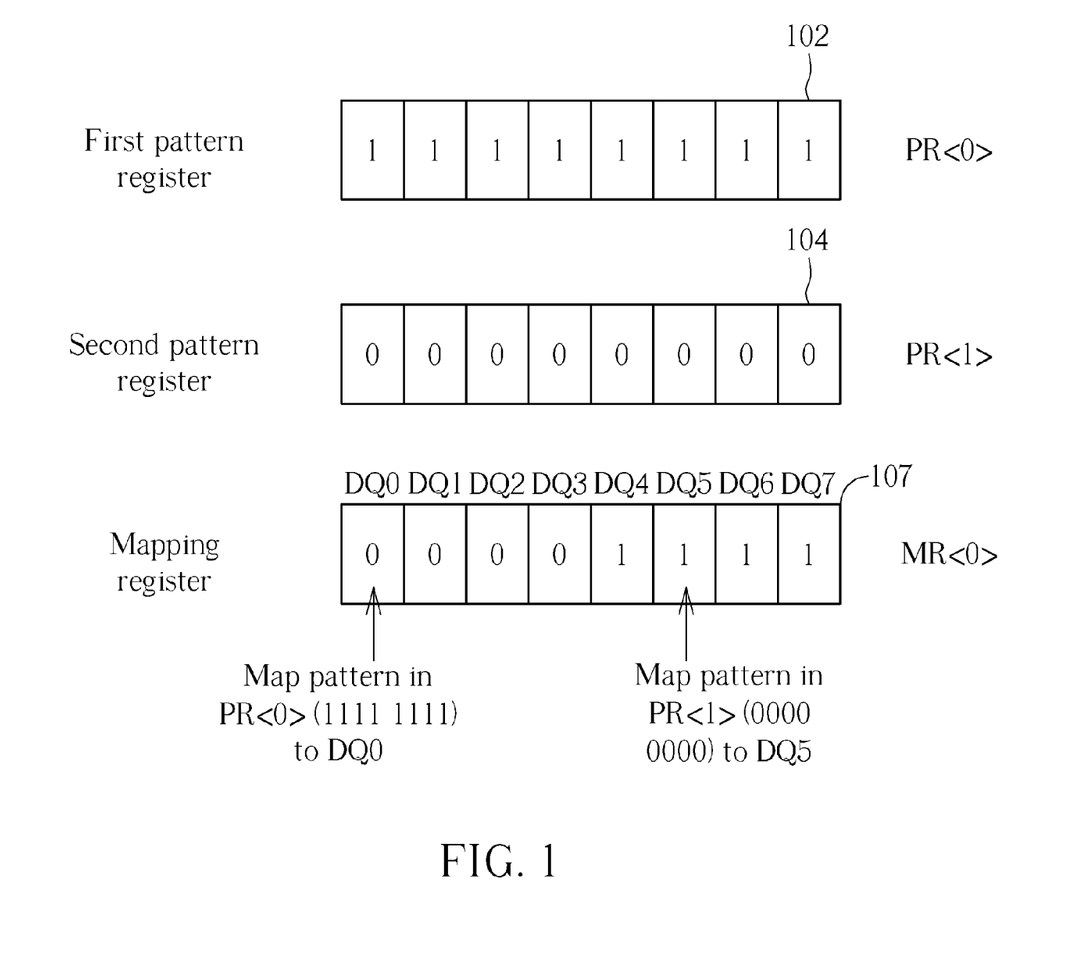
FIG. 1 is a diagram of a register scheme for a DRAM according to a first exemplary embodiment of the present invention.

"As illustrated in the diagram, the first pattern register 102 stores an 8-bit data pattern consisting of 8 'ONES' and the second pattern register 104 stores an 8-bit data pattern consisting of 8 'ZEROS'. The first mapping register 107 stores a series of 'ONES' and 'ZEROS' for indicating which data pattern will be output to which data path. Each bit in the mapping register corresponds to a data path DQ<0:7>, and the binary values stored therein correspond to either the first data pattern or the second data pattern. In other words, mapping bits DQ<0:3> correspond, respectively, to data paths DQ<0:3>. As the mapping register stores four 'ZEROS' in these four bits, data paths DQ<0:3> will all output the data pattern stored in the first pattern register 102, which is a 'hi' value of 8 'ONES'. Similarly, mapping bits DQ<4:7> correspond, respectively, to data paths DQ<4:7>. As the mapping register 107 stores four 'ONES' in these four bits, data paths DQ<4:7> will all output the data pattern stored in the second pattern register 104, which is a 'lo' value of 8 'ZEROS'. In this way, two distinct data patterns can be output on the data paths without a need to access the array in a read operation."

Figure 2:
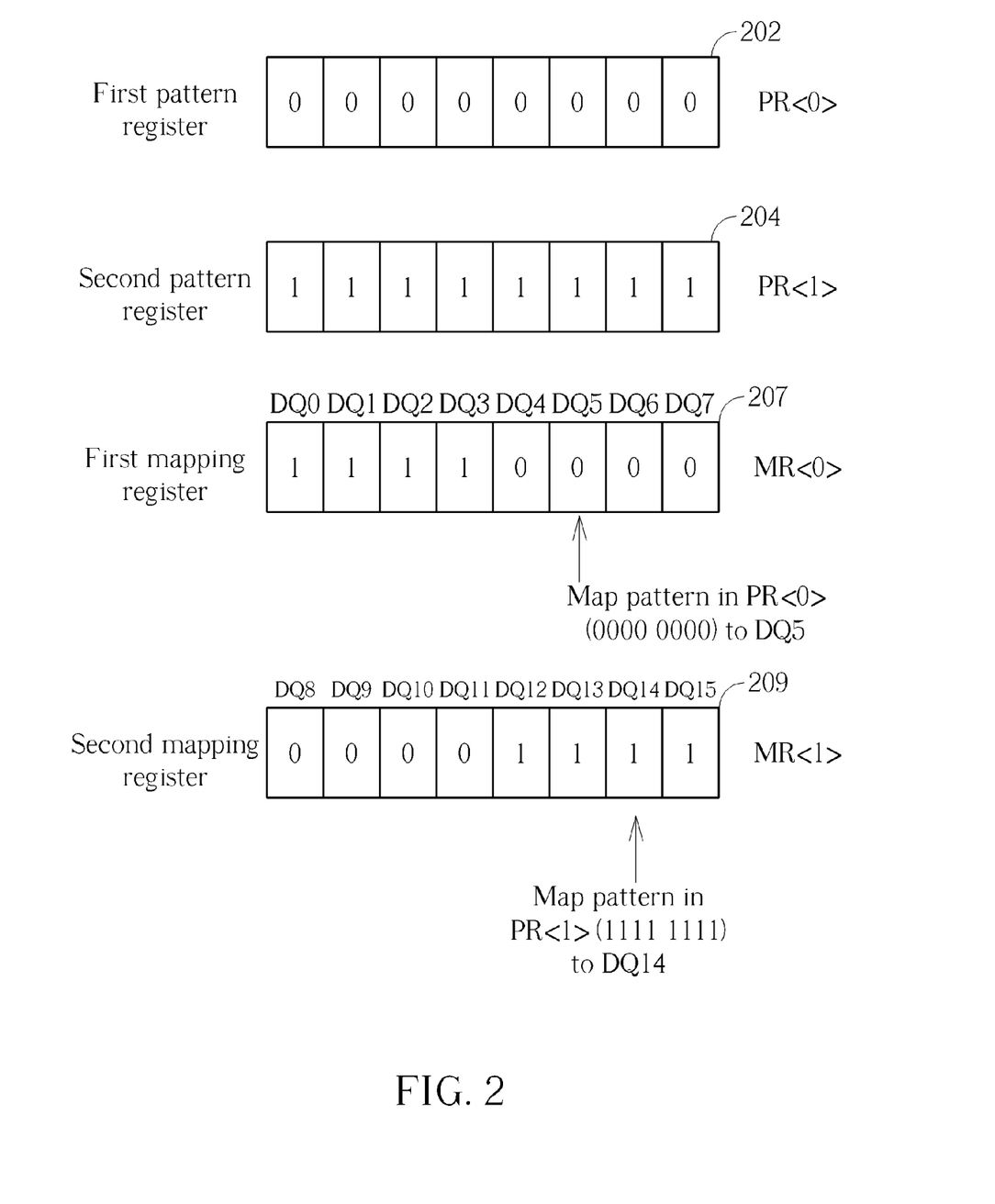
FIG. 2 is a diagram of a register scheme for a DRAM according to a second exemplary embodiment of the present invention.

It is also possible to have more than one mapping register, as illustrated in FIG. 2. AS shown in this diagram, there are 16 possible data paths corresponding to the 8-bit mapping registers, 207, 209. As before, when the mapping register 207/209 stores a 'ONE', the data pattern in the second pattern register 204 will be output on the corresponding data path; when the mapping register 207/209 stores a 'ZERO', the data pattern in the first pattern register 202 will be output on the corresponding data path.

Figure 3:
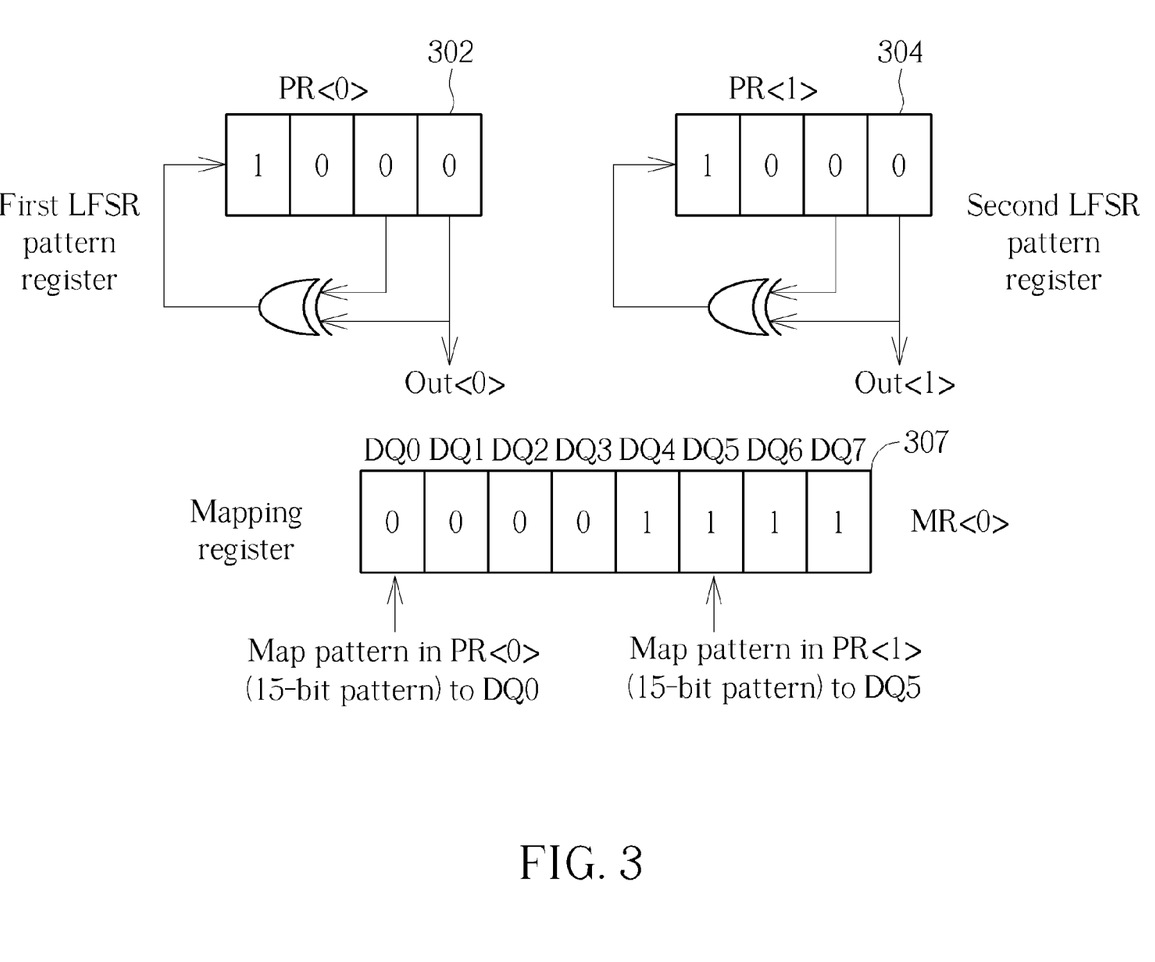
FIG. 3 is a diagram of a register scheme for a DRAM, wherein the registers are Linear Feedback Shift Registers, according to a third exemplary embodiment of the present invention.

It is possible that a data pattern longer than the number of bits of the pattern register may be output on the read data path. In this case, the pattern register can be modified to be a Linear Feedback Shift Register (LFSR), as illustrated in FIG. 3. The first pattern register 302 is a 4-bit register, comprising an XOR gate having an output coupled to the leading bit of the first pattern register 302, and having two inputs respectively coupled to the third and fourth bit of the first pattern register 302. The second pattern register 304 is a 4-bit register, comprising an XOR gate having an output coupled to the leading bit of the second pattern register 304, and having two inputs respectively coupled to the third and fourth bit of the second pattern register 304. In this way, the pattern register 302 and the second pattern register 304 can store two distinct data patterns, which will be repeated every 15 cycles. As in the register structure illustrated in FIG. 1, the first mapping register 307 stores a series of 'ONES' and 'ZEROS' for indicating which data pattern will be output to which data path. Each bit in the mapping register corresponds to a data path DQ<0:7>, and the binary values stored therein correspond to either the first data pattern Out<0>, which is output by the first pattern register 302, or the second data pattern Out<1>, which is output by the second pattern register 304.

In situations where the data pattern to be read is longer than 8 bits, but there is no LFSR, it is possible to use inverting logic or mapping register rewrite to successfully output all data. The following example uses the registers illustrated in FIG.1 as an example. A data pattern to be output has 15 bits. This data pattern will be written to both pattern registers 102, 104. Initially, the mapping register 107 is set to output the data pattern in the first pattern register 102 to all data paths (i.e. all bits in the mapping register MR<0> are 'ZERO'). The bits in the mapping register 107 are then inverted so that the data pattern in the second pattern register 104 is output to all data paths (i.e. all bits in the mapping register MR<0> are 'ONE'). A straight inversion of the bits therein may be performed, or a logic operation can be performed to invert the bits. If a data pattern is longer than 15 bits, the data in the pattern registers 102, 104 may be rewritten to extend the data pattern stored therein. Alternatively, if a second data pattern is to be output, the pattern registers 102, 104 can be rewritten to store the second data pattern, and the mapping register 107 will have a corresponding binary mask written to it, for outputting the correct data pattern.

Please note that the above numbers of pattern registers and mapping registers are provided as exemplary embodiments of the invention, but are not intended in a limiting sense. Those skilled in the art may make modifications to the above after reading the disclosure. For example, more than two pattern registers may be provided, as long as the number of mapping bits in the mapping register(s) is sufficient. Further, the above is not limited to memory devices.

The pattern registers of the present invention may be both write-able and read-able so that new data patterns can be written therein, or may be read-able only. In this case, the pattern registers will be hard-coded with the data patterns.

Figure 5:
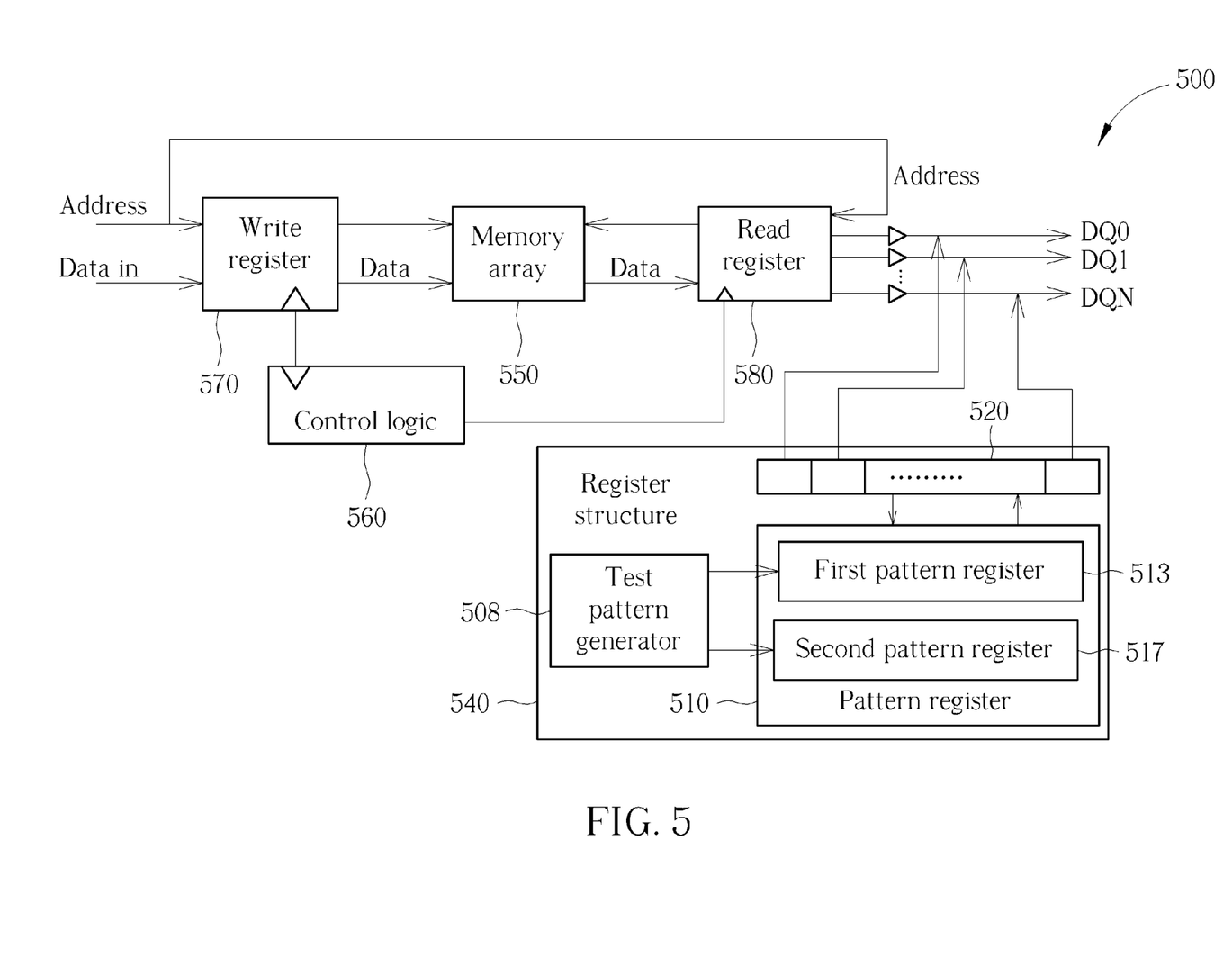
FIG. 5 is a diagram of a register structure and a memory array according to an exemplary embodiment of the present invention.

FIG. 5 illustrates a data system 500, comprising a memory array 550, wherein data can be written to the memory array 550 by means of a write register 570, and has data can be read out from the memory array 550 by means of a read register 580. Address signals are input to both the write register 570 and the read register 580 for performing these operations. Timing of the registers is performed by a control logic 560. Data read out from the read register 580 will be output on a plurality of data output paths DQ0~DQN, wherein the total number of data output paths =N+1. A register structure 540 can output test data patterns to the data output paths DQ0~DQN without accessing the memory array 550. The register structure 540 includes a test pattern generator 508 which generates test data patterns to a pattern register 510. More specifically, the test pattern generator 508 generates at least a first test data pattern and a second test data pattern to, respectively, a first pattern register 513 and a second pattern register 517 within the pattern register 510. The pattern register 510 is coupled to a mapping register 520, which (as detailed in the above) comprises a plurality of bit registers (N+1 in this example) respectively corresponding to the plurality of data output paths. Each bit registers contains a ZERO or a ONE, indicating whether the test data pattern in the first pattern register or the test data pattern in the second pattern register should be output to the corresponding data output path.

The above embodiments are particularly suitable for use in a DDR4 array. The DDR4 array defines four write-able Multi-purpose registers (MPR). Each MPR consists of four logical pages, wherein there are four 8-bit registers per page. Only Page 0 is both write-able and read-able, and therefore is the only page which applies to the present invention.

Figure 4A:
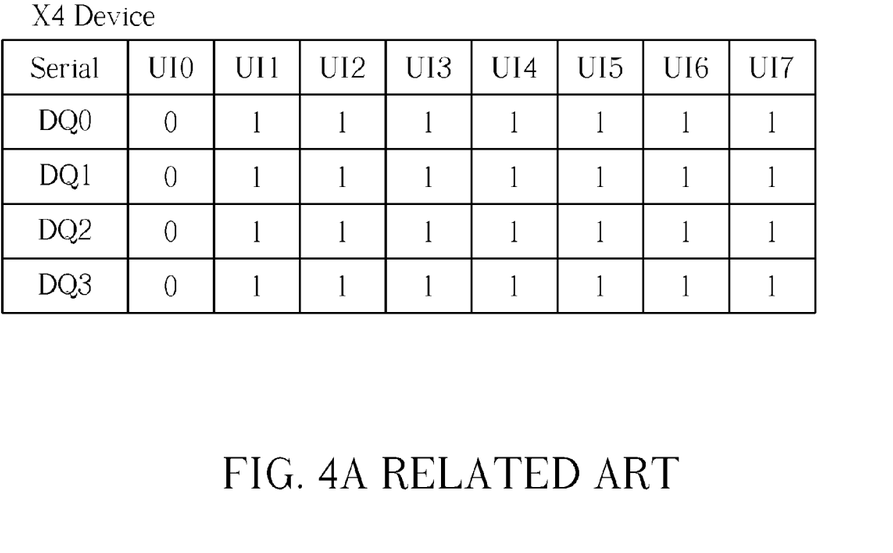
FIG. 4A is a related art diagram of a data pattern read out from a Multi-purpose Register (MPR) in serial mode.
Figure 4B:
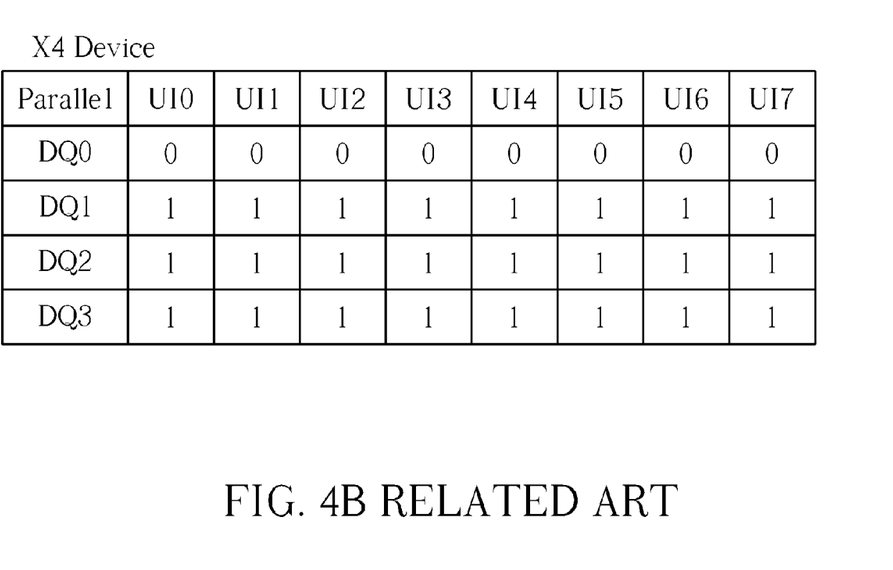
FIG. 4B is a related art diagram of a data pattern read out from an MPR in parallel mode.
Figure 4C:
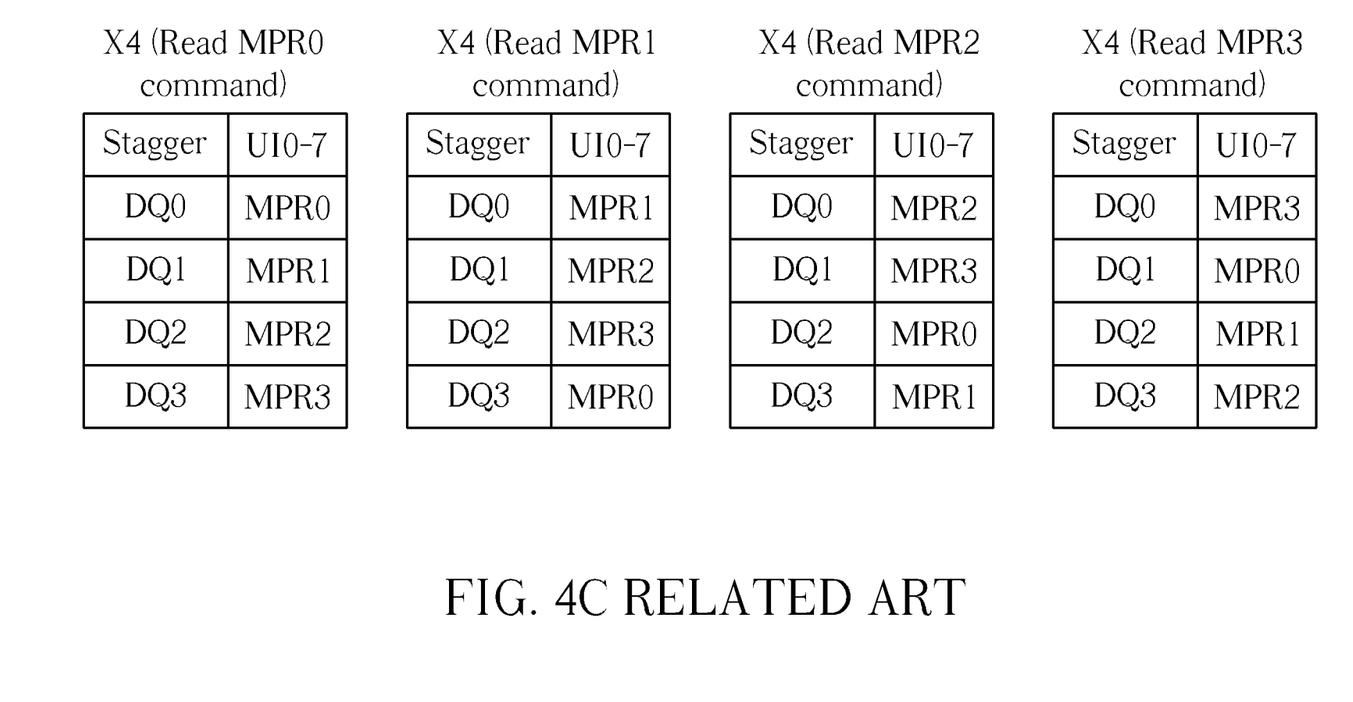
FIG. 4C is a related art diagram of a data pattern read out from an MPR in staggered mode.

The DDR4 spec allows data to be mapped to output data paths in three different modes. These three modes are illustrated in FIGS. 4A~4C. Serial mode maps the same serial data pattern to each data path, as illustrated in FIG. 4A. In parallel mode, each data path may output a different data pattern, but each bit will be repeated, as illustrated in FIG. 4B. In staggered mode, the data will be staggered across the lanes, as illustrated in FIG. 4C.

Default values are defined for the registers by the DDR4 specification, but the concept of the present invention can be used to write any custom values therein. Further, the concept of the invention means that more than one data pattern can be output by the MPRs, regardless of the output mode.

The MPRs can function in a similar way to the embodiment illustrated in FIG.2. A first MPR R<0> and a second MPR R<1> operate as the pattern registers, and store a first pattern A and a second pattern B. The third MPR R<2> and fourth MPR R<3> store a binary sequence which indicates whether the first pattern A or the second pattern B will be output. As before, the data patterns may be written to the MPRs in an MPR write state, or the data patterns may be hard-coded so the write state is not needed.

The third and fourth MPRs are loaded with masks, wherein each bit corresponds to a particular data output path, such that the bits of the third multi-purpose register MPR R<2> respectively map to DQ<0:7>. The following is an example of output of two data patterns, A and B.

R<0>=0000 0000
R<1>=1111 1111
R<2>=0000 1111
R<3>=0101 1100

Data pattern A (0000 0000) is loaded to the first MPR R<0> and data pattern B (1111 1111) is loaded to the second MPR R<1>. The third MPR R<2> is loaded with a binary mask (0000 1111) for the lower data output paths (LDQ) and the fourth MPR R<3> is loaded with a binary mask (0101 1100) for the upper data output paths (UDQ).

DQ<0:3> will output data in R<0>
DQ<4:7> will output data in R<1>
DQ<8, 10, 14, 15> will output data in R<0>
DQ<9, 11, 12, 13> will output data in R<1>.

In summary, the present invention discloses a fast and efficient method for performing read signal integrity characterization on a DRAM/DDR4 memory that bypasses the main memory array and can therefore obtain more accurate results without being affected by noise and signal timing constraints. Further, the use of pattern registers and mapping registers near the read path means that two distinct data patterns can be output at the same time. This further improves the efficiency of the above scheme.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A register structure that can perform characterization of output data paths without accessing a memory array, the register structure comprising:
   at least a first pattern register and a second pattern register, for respectively storing a first test data pattern and a second test data pattern, wherein the first test data pattern and the second test data pattern are different from each other, the first pattern register and the second pattern register are both 8-bit registers, and the first test data pattern and the second test data pattern are both greater than 8 bits; and
   at least a first mapping register comprising a plurality of bit registers, each bit register corresponding to an output data path and storing a binary value, wherein each binary value indicates which of the first test data pattern or the second test data pattern should be mapped to a corresponding output data path and at least one bit register stores a binary value which is different from the binary value stored in the other bit registers,
   wherein the first test data pattern is stored in the first pattern register and the second pattern register, and read out to the output data paths by making all binary values in the first mapping register correspond to the first pattern register, and then inverting all binary values in the first mapping register to correspond to the second pattern register.

2. The register structure of claim 1, wherein the first mapping register is an 8-bit register, and each bit corresponds to a different output data path.

3. The register structure of claim 1, further comprising a second mapping register, for storing a plurality of binary values, wherein each binary value indicates whether the first test data pattern or the second test data pattern should be mapped to a corresponding output data path.

4. The register structure of claim 3, wherein the memory array is a DDR4 DRAM, and the first pattern register, the second pattern register, the first mapping register and the second mapping register are multi-purpose registers of the DDR4 memory.

5. The register structure of claim 1, wherein the first pattern register and the second pattern register are both 8-bit registers, and the first test data pattern and the second test data pattern are both 8-bit data patterns.

6. The register structure of claim 1, wherein the first pattern register and the second pattern register are both 8-bit linear feedback shift registers, and the first test data pattern and the second test data pattern are both 63-bit data patterns.

7. The register structure of claim 1, wherein the second test data pattern is then stored in the first pattern register and the second pattern register, and read out to the output data paths by making all binary values in the first mapping register correspond to the first pattern register, and then inverting all binary values in the first mapping register to correspond to the second pattern register.

8. A method for performing characterization of output data paths without accessing a memory array of a memory, the method comprising:
   designating a register of a plurality of registers as a first pattern register and storing a first test data pattern therein;
   designating a register of the plurality of registers as a second pattern register and storing a second test data pattern therein, wherein the first test data pattern and the second test data pattern are different from each other, the first pattern register and the second pattern register are both 8-bit registers, and the first test data pattern and the second test data pattern are both greater than 8 bits;
   designating a register of the plurality of registers as a first mapping register, the first mapping register comprising a plurality of bit registers, each bit register corresponding to an output data path, and respectively storing a plurality of binary values in the plurality of bit registers;
   accessing the binary values in the first mapping register to determine whether the first test data pattern or the second test data pattern should be mapped to a corresponding output data path; and
   outputting the first test data pattern or the second test data pattern according to the binary values in the first mapping register, comprising:
   storing the first test data pattern in the first pattern register and the second pattern register;
   making all binary values in the first mapping register correspond to the first pattern register;
   mapping the first test data pattern in the first pattern register to the output data paths;
   inverting all binary values in the first mapping register to correspond to the second pattern register; and
   mapping the first test data pattern in the second pattern register to the output data paths.

9. The method of claim 8, wherein the first mapping register is an 8-bit register, and each bit corresponds to a different output data path.

10. The method of claim 8, further comprising:
    designating a register of the plurality of registers as a second mapping register and storing a plurality of binary values therein, wherein each binary value corresponds to an output data path;
    the step of accessing the binary values in the first mapping register further comprises:
    also accessing the binary values in the second mapping register to determine whether the first test data pattern or the second test data pattern should be mapped to a corresponding output data path; and
    the step of outputting the first test data pattern or the second test data pattern on a corresponding output data path further comprises:
    also outputting the first test data pattern or the second test data pattern on a corresponding output data path according to the binary values in the second mapping register.

11. The method of claim 10, wherein the memory is a DDR4 DRAM, and the first pattern register, the second pattern register, the first mapping register and the second mapping register are multi-purpose registers of the DDR4 memory.

12. The method of claim 8, wherein the first pattern register and the second pattern register are both 8-bit registers, and the first test data pattern and the second test data pattern are both 8-bit data patterns.

13. The method of claim 8, wherein the first pattern register and the second pattern register are both 4-bit linear feedback shift registers, and the first test data pattern and the second test data pattern are both 15-bit data patterns.

14. The method of claim 8, further comprising:
- storing the second test data pattern in the first pattern register and the second pattern register;
- making all binary values in the first mapping register correspond to the first pattern register;
- mapping the second test data pattern in the first pattern register to the output data paths;
- inverting all binary values in the first mapping register to correspond to the second pattern register; and
- mapping the second test data pattern in the second pattern register to the output data paths.

* * * * *